(12) United States Patent
Sano

(10) Patent No.: US 6,399,943 B1
(45) Date of Patent: Jun. 4, 2002

(54) PACKAGED ELECTRONIC PART HAVING MOUNTING LEG

(75) Inventor: Masashi Sano, Kyoto (JP)

(73) Assignee: Rohm Co., Ltd, Kyoto (JP)

( * ) Notice: Subject to any disclaimer, the term of this patent is extended or adjusted under 35 U.S.C. 154(b) by 0 days.

(21) Appl. No.: 09/319,351
(22) PCT Filed: Oct. 7, 1998
(86) PCT No.: PCT/JP98/04540
§ 371 (c)(1),
(2), (4) Date: Jun. 4, 1999
(87) PCT Pub. No.: WO99/19915
PCT Pub. Date: Apr. 22, 1999

(30) Foreign Application Priority Data

Oct. 9, 1997  (JP) ............................................. 9-314180

(51) Int. Cl.⁷ .................................................. H01J 5/02
(52) U.S. Cl. ....................................... 250/239; 250/551
(58) Field of Search ................................ 250/239, 551; 259/80–82; 439/567, 83; 385/88, 92, 94

(56) References Cited

U.S. PATENT DOCUMENTS 5,409,386 A * 4/1995 Banakis et al. ............... 439/83
5,520,551 A * 5/1996 Broschard, III ............. 439/567
5,567,953 A * 10/1996 Horinouchi et al. ......... 250/551
5,655,042 A * 8/1997 Atanovich et al. ............ 385/88
5,824,257 A * 10/1998 Dashevsky et al. ...... 264/328.1

FOREIGN PATENT DOCUMENTS

| JP | 3-97947 | 10/1991 | ........... H01L/31/12 |
| JP | 3-106763 | 11/1991 | ........... H01L/31/12 |
| JP | 6-97488 | 4/1994 | ........... H01L/31/12 |

* cited by examiner

Primary Examiner—Que T. Le
Assistant Examiner—Thanh X. Luu
(74) Attorney, Agent, or Firm—Hoffmann & Baron, LLP

(57) ABSTRACT

An electronic part is, for example, a double molded photo-interrupter. The photo-interrupter incorporates a light emitting device and a light receiving device which are encapsulated with a light-transmitting resin. The two devices are packaged into one body with an opaque synthetic resin in such a way as to be opposed to each other. A through-hole is formed through the resin package and hooks extended downward from the bottom face of the package near the through hole are integrally formed with the package.

10 Claims, 6 Drawing Sheets

PACKAGED ELECTRONIC PART HAVING MOUNTING LEG

TECHNICAL FIELD

The present invention relates generally to electronic parts. More particularly, this invention relates to an electronic part having a hook or mounting leg formed at an underside of a package to be mounted on a circuit board through using the hook or mounting leg, such as a double-molded photo-interrupter having light-emitting and light-receiving devices each molded a light transmissive synthetic resin to be packaged together into a package of an opaque synthetic resin.

PRIOR ART

Japanese Patent Laid-Open No. 6-97488, which was laid open to public on Apr. 8, 1994, discloses one example of a double-molded photo-interrupter as a background of this invention. In the photo-interrupter of this kind, an object passing between the light emitting and light receiving devices is detected depending upon the change in amount of the light received by the light receiving device.

The conventional double-molded photo-interrupter 1, shown in FIG. 1, is analogous to the technology disclosed in the above publication, and includes a light emitting device 2 and a light receiving device 3. These light emitting device 2 and light receiving device 3 are packaged together by a synthetic resin package 4. In packaging, the light emitting device 2 and the light receiving device 3 are placed opposite to each other with a predetermined spacing given. The package 4 is formed generally in a U-character form as viewed from the side. The package 4 has, at its underside, two hooks 5 formed extending downward with a spacing given between them. Each hook 5 at a tip is formed with a claw 5a. It is therefore possible to mount the photo interrupter 1 onto a top surface of a circuit board 6 by inserting the hook 5 into a through-hole 6a of the circuit board 6 and engaging the claw 5a with a backside of the circuit board 6, as shown in FIG. 2.

However, there is a problem in the FIG. 1 conventional art in that burrs 7 occur at a top surface of the hook 5 claw 5a and hook 5 side surface as shown in FIG. 2 when a resin package 4 is formed by a metal mold. If such burrs occur on the hook 5 and the claw 5a, it becomes difficult to insert the hook 5 into a board hole 6a. Due to this, the prior art has required a post-forming process to remove away burrs 7. Moreover, such post-forming is troublesome and ultimately results in increase in photo-interrupter cost.

SUMMARY OF THE INVENTION

Therefore, it is a primary object of the present invention to provide a novel electronic part which can be mounted using a mounting leg onto a circuit board.

It is another object of the present invention to provide an electronic part free of burrs on the mounting leg which are obstructive to its mounting onto a circuit board.

It is further object of the present invention to provide a double-molding photo-interrupter fee of burrs on the mounting leg as which are obstructive to its mounting onto a circuit board.

An electronic part according to the present invention, comprises: a mounting base formed by resin molding, the mounting base being formed to have an upper surface and a lower surface, the lower surface being placed on an upper surface of a circuit board; an opening penetrating from the upper surface to the lower surface of the mounting base; and a mounting leg formed resin molding integral with the mounting base in a manner extending from the lower surface of the mounting base in a position close to the opening, the mounting leg being formed by a metal mold to form the opening.

The mounting base and the mounting leg are integrally formed through an injection mold method with a synthetic resin by a plurality of metal mold parts to define upper, lower, left and right surfaces of them. At this time, an opening is simultaneously formed by another metal mold part penetrating through the mounting base. This other metal mold part extends to a lower position than an underside of the mounting base. This other metal mold at side surfaces define side surfaces for the mounting leg. Accordingly, no burrs occur on side surfaces of the mounting leg.

In one aspect of the present invention, the mounting leg includes a claw formed at a lower end and integral with the mounting leg, the mounting leg having a side surface thereof defined by a side surface of the metal mold, and the claw having an upper surface defined by a lower surface of the metal mold. Accordingly, burrs can be prevented from being formed on the upper surface of the claw.

According to the present invention, no burrs occur on the mounting leg extending from the underside of the mounting base during resin molding. It is possible to easily insert the mounting leg into a mount hole formed in a circuit board and positively engage the claw with a board backside, differently from the prior art. Therefore, according to the present invention, there is no necessity of removing burrs in a post-forming process. It is possible to provide electronic parts of this kind at lower cost.

Incidentally, where structuring a double-molded photo-interrupter according to the present invention, the electronic part further comprising: a first portion and a second portion that are integrally formed with the mounting base, the first portion and the second portion extends upward from the upper surface of the mounting base and formed with a spacing given between; a light emitting device accommodated in the first portion, the light emitting device including a light emitting chip molded by a light transmissive resin; and a light receiving device accommodated in the second portion, the light receiving device including a light receiving chip molded by a light transmissive resin, the light receiving chip receiving light from the light emitting chip.

The above described objects and other objects, features, aspects and advantages of the present invention will become more apparent from the following detailed description of the present invention when taken in conjunction with the accompanying drawings.

BEST FORM FOR PRACTICING THE INVENTION

Explanations will be made below on an embodiment that this invention is applied to a double-molded photo-interrupter. However, it is previously pointed out that this invention is broadly applicable to such arbitrary kinds or forms of electronic parts that have a resin package and a mounting leg extending integrally from an underside thereof.

Figure 3:
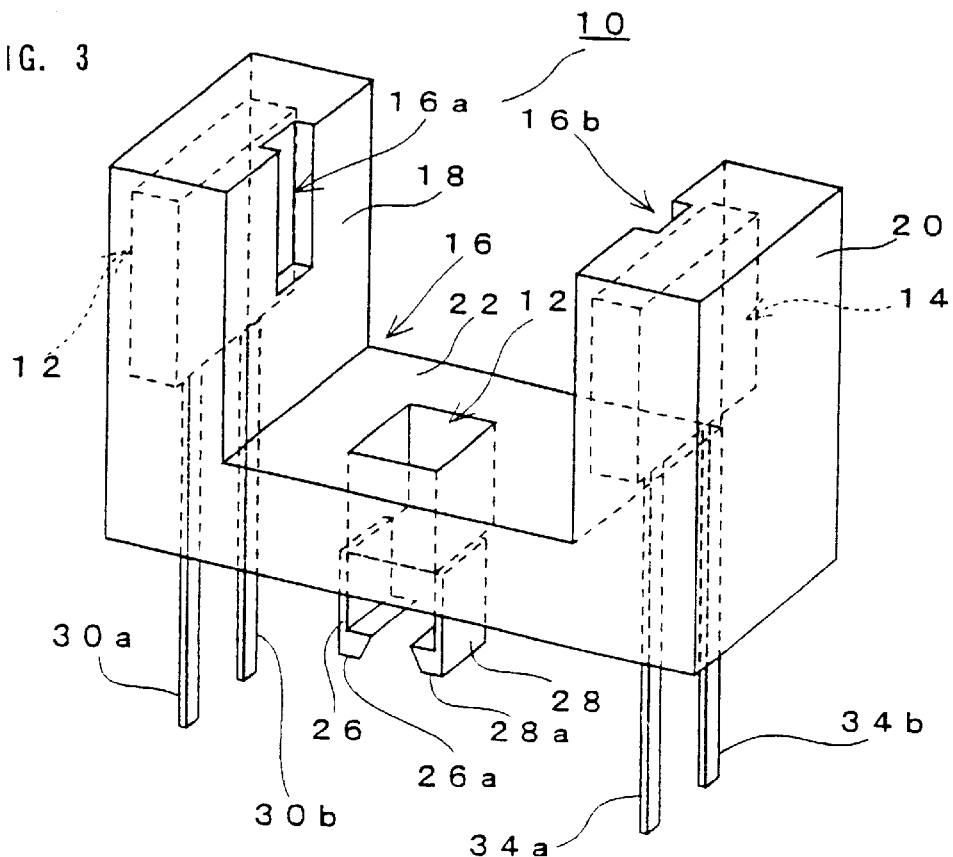
FIG. 3 is a perspective view showing, by omitting a part, a double-molded photo-interrupter as one embodiment of this invention.

FIG. 3 shows a double-molded photo-interrupter 10 as one embodiment of this invention, which includes a light emitting device 12 and a light receiving device 14. These devices 12 and 14 are molded together by a resin package 16. The resin package 16 is formed of an opaque resin generally in a U-character form.

Figure 2:
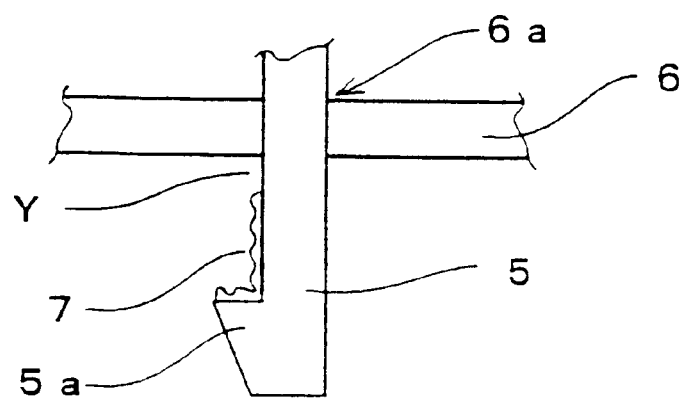
FIG. 2 is an illustrative view showing a state that in the prior art of Fig. 1 the photo-interrupter is mounted on a circuit board with its hook inserted in a mount hole of the board.

The resin package 16 includes a first portion 18, a second portion 20 and a mount base 22. The first portion 18 accommodates therein the light emitting device 12, while the second portion 20 accommodates therein the light receiving device 14. The mount base 22 has an opening or through-hole 24 penetrating from a top surface to a bottom surface thereof. In the embodiment, a pair of hooks 26 and 28 are formed at an peripheral edge of the mount base 22 defining the through-hole 24, which extend downward from the underside of the mount base in positions close to this through-hole 24. The pair of hooks 26 and 28 are inserted into the mount hole formed in a circuit board (corresponding to 6a in FIG. 2). Then, respective claws 26a and 28a of the hooks 26 and 28 are engaged with a backside of the circuit board. Due to this, the photo-interrupter 10 is mounted on a top surface of the circuit board.

Figure 4:
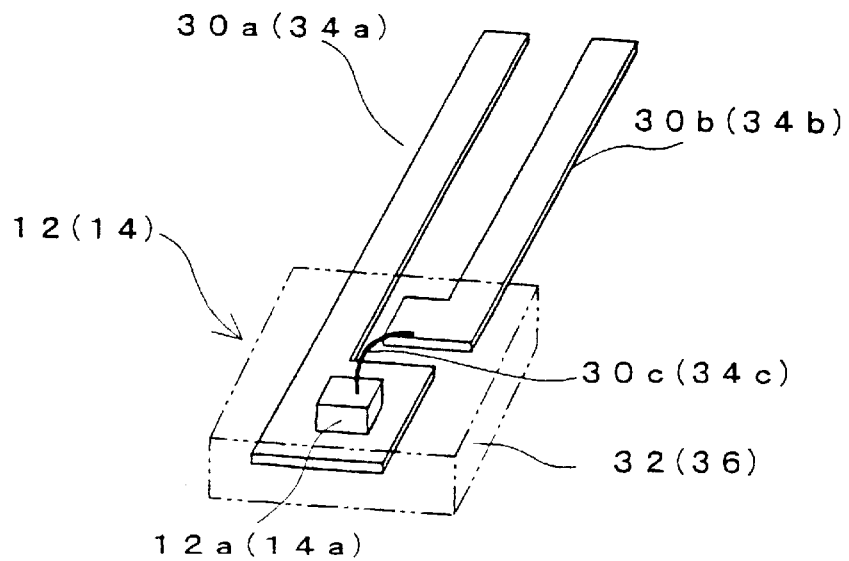
FIG. 4 is a perspective view showing a light emitting device of the FIG. 1 embodiment.

The light emitting device 12 includes a light emitting tip 12a, as shown in FIG. 4. This light emitting tip 12a is die-bonded on one lead terminal 30a. Wire-bonding is made between the light emitting tip 12a and the other lead terminal 30b through a metal sin wire 30c. In this state, the light emitting tip 12a is molded by a light-transmissive resin mold 32. Similarly, the light receiving device 14 includes a light receiving tip 14a. This light receiving tip 14a is die-bonded onto one lead terminal 34a. The light receiving tip 14a and other lead terminal 34b are wire-bonded through a metal sin wire 34c. In this state, the light receiving tip 12a is molded by a light-transmissive resin mold 36.

The light emitting device 12 and the light receiving device 14 thus formed are packaged together using a metal mold into an opaque resin package 16. At this time, the light emitting device 12 is positioned in the first portion 18, while the light receiving device 14 is in the second portion 20. Accordingly, the light emitting tip 12a (FIG. 4) of the light emitting device 12 and the light receiving tip 14a of the light receiving element 14 are placed opposite to each other with a predetermined gap given between them so that the light receiving tip 14a can receive at its light receiving portion the light outputted from a light emitting portion of the light emitting tip 12a. The resin package 16 has openings formed in respective corresponding positions to a light emitting surface, or a light emitting portion, of the light emitting device 12 and a light receiving surface, or a light receiving portion, of the light receiving device 14. Incidentally, this resin package is integrally formed with hooks 26 and 28 extending from an underside of the resin package 16.

Figure 5:
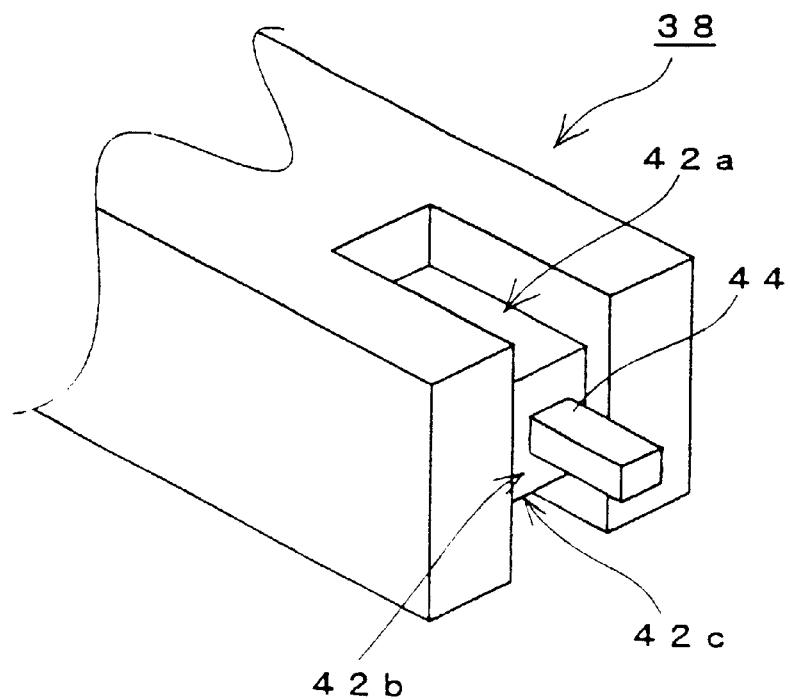
FIG. 5 is a perspective view showing a first movable metal mold used for forming a resin package of the FIG. 1 embodiment.
Figure 6:
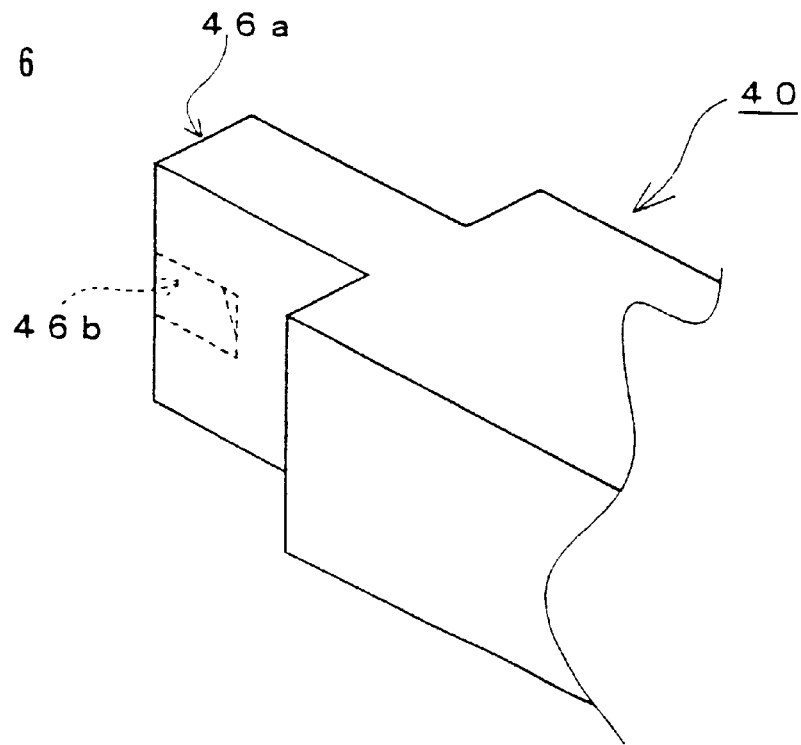
FIG. 6 is a perspective view showing a second movable metal mold used for forming the resin package of the FIG. 1 embodiment.

Specifically, used are a first movable metal mold 38 and a second movable metal mold 40 as shown in FIG. 5 and FIG. 6. The first movable metal mold 38 includes, as shown in FIG. 5, a first concave flat surface 42a, a second concave flat surface 42b and a third concave flat surface 42c. The first concave flat surface 42a, the second concave flat surface 42b and the third concave flat surface 42c serve to define, respectively, a second portion inner surface, second portion, a mount base 22 top surface and a first portion 18 inner surface, for a resin package 16. The second concave flat surface 42b has a projection 44 formed thereon. This projection 44 is utilized to form a through-hole 24 and hooks 26 and 28 for the mount base 22.

The second movable metal mold 40 includes, as shown in FIG. 6, a convex flat surface 46a and a recess 46b formed almost in a center of the convex flat surface 46. The convex flat surface 46a defines an underside of the mount base 22 for the resin package 16. The recess 46b is utilized to form hooks 26 and 28.

Figure 1:
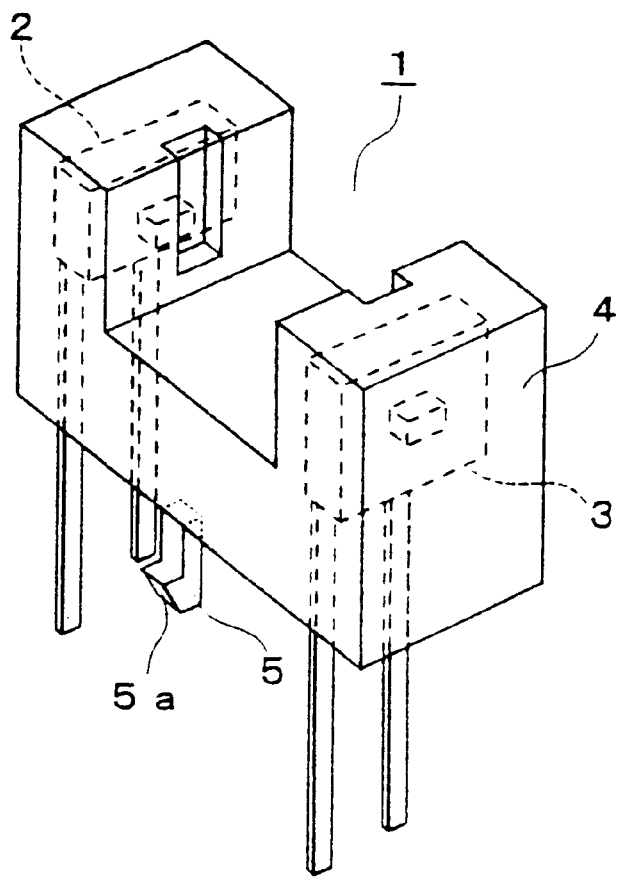
FIG. 1 is a schematic perspective view showing one example of an prior art photo-interrupter as a background of this invention.
Figure 7:
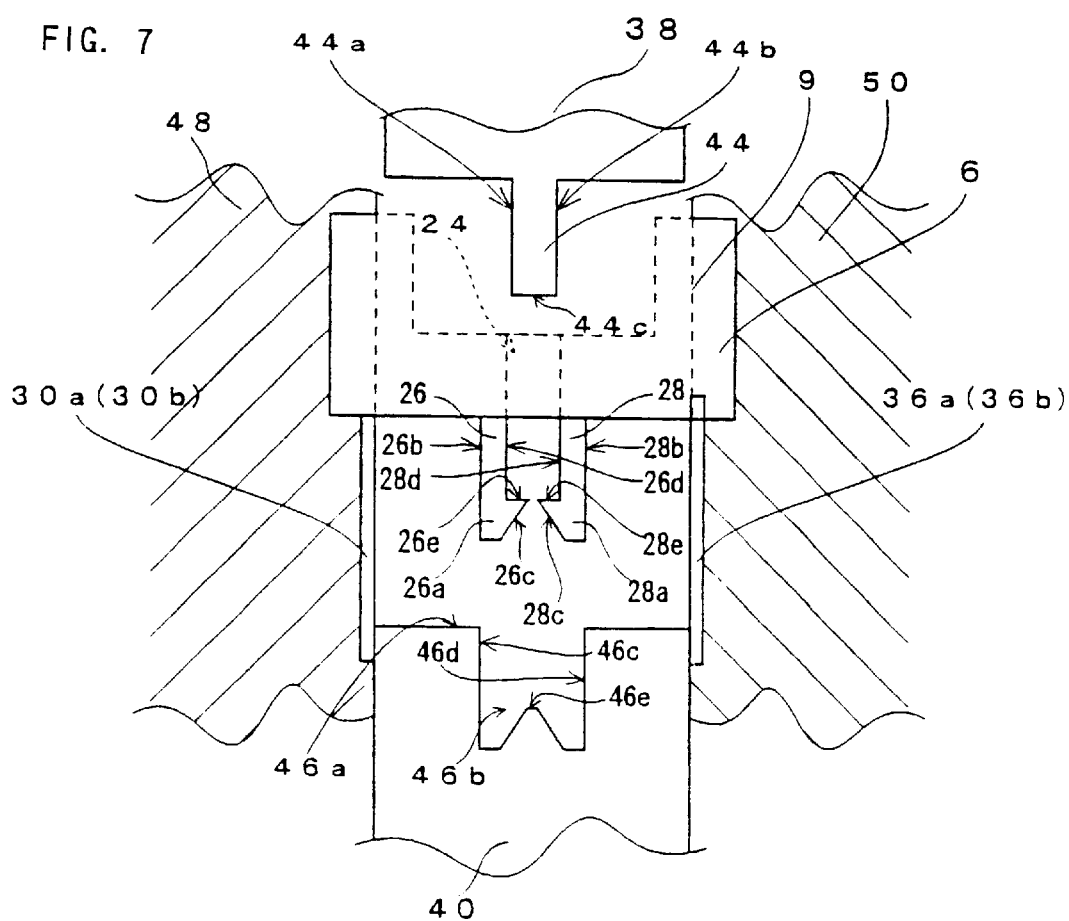
FIG. 7 is an illustrative view showing one example of metal molds arranged to injection-mold a resin package with a hook by using a first fixed metal mold, a second fixed metal mold and movable metal molds of FIG. 5 and FIG. 6.

Referring to FIG. 7, the first movable metal mold 38 and the second movable metal mold 40, as were shown in FIG. 5 and FIG. 6, are inserted from above and below into a sectionally-rectangular cavity encompassed by a first fixed metal mold 48 and a second fixed metal mold 50. It will be readily understood that the first movable metal mold 38 and the second movable metal mold 40 is contacted, at their side surfaces, with cavity inner wall surfaces defined by the fixed metal molds 48 and 50. Incidentally, the first fixed metal mold 48 has, in its inner surfaces, a recessed portion to define an outer surface of the first portion 18 (FIG. 1) for the resin package 16 and a recessed portion to hold lead terminals 30a and 30b of the light emitting device 12 (FIG. 3, FIG. 4), respective of which are formed in predetermined positions. Similarly, in the inner surface of the second fixed metal mold 50, formed are a recessed portion to define an outer surface of the second portion 20 for the resin package 16 (FIG. 1) and a recessed portion to hold the lead terminals 36a and 36b of the light receiving device 14, respective of which are formed in predetermined positions.

Although the second movable metal mold 40 is formed with the convex flat surface 46a and concave portion 46b as stated above, this recessed portion 46b is defined by inner surfaces 46c and 46d and a bottom surface 46e. The inner surface 46c defines an outer surface 26b for the hook 26, while the inner surface 46d defines an outer surface 28b of the hook 28. The bottom surface 46d defines lower slant surfaces 26c and 28c for respective claws 26a and 28a of the hooks 26 and 28.

Also, the projection 44 side surfaces 44a and 44b of the first movable metal mold 38, respectively, define the inner surfaces 26d and 28d of the hooks 26 and 28. The underside 44c of the projection 44 defines respective upper surfaces 26e and 28e of the claws 16a and 28a of the hooks 26 and 28. Incidentally, the underside 44c is directly contacted with the recessed portion 46b bottom surface 46e, thereby providing a gap between the hook 26 and the hook 28.

By moving first movable metal mold 38 downward and the second movable metal mold part 40 upward to respective predetermined positions, a cavity is formed to define outer surfaces for a resin package 16 and hooks 26 and 28. The cavity is poured by a melt opaque resin. After setting the resin, the metal molds 38, 40, 48 and 50 are disassembled. Thus, a double-molded photo-interrupter 10 (FIG. 3) is completed which has a resin package 16 integrally formed with hooks 26 and 28.

Figure 8:
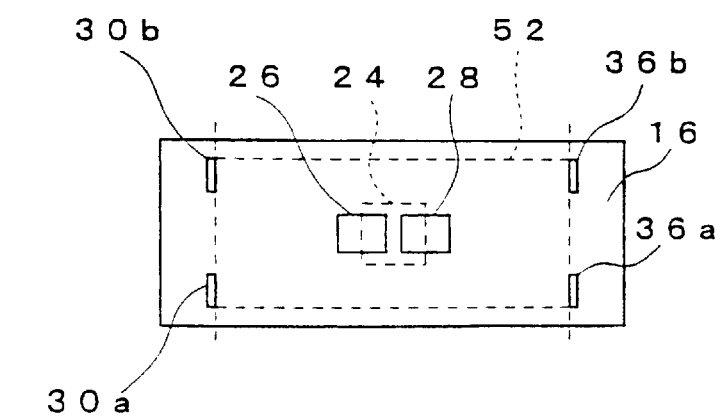
FIG. 8 is an illustrative view of a state of FIG. 7 as viewed from the bottom.

Incidentally, when the metal molds 38, 40, 48 and 50 are disassembled, parting lines 52 shown in FIG. 7 and FIG. 8 are formed. However, no parting lines are formed on the side surfaces of the hooks 26 and 28 or the upper surfaces of the claws 26a and 28a. Accordingly, burrs shown in FIG. 2 do not occur on the hooks 26 and 28.

Figure 9:
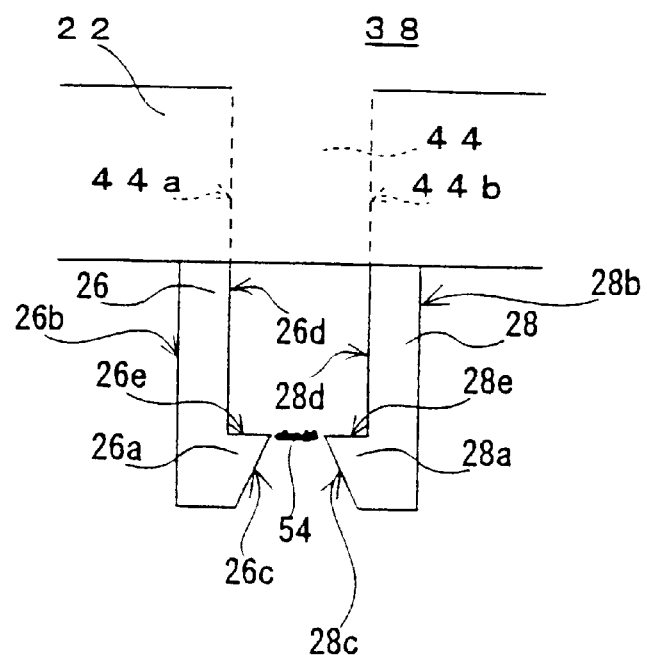
FIG. 9 is an illustrative view showing, by magnification, a hook formed according to FIG. 7.

Explaining in greater detail with reference to FIG. 9, the inner surfaces 26f and 28f of the hooks 26 and 28 are defined by the projection 44 side surfaces 44a and 44b of the first movable metal mold part 38. Consequently, no parting lines exist on these inner surfaces 26f and 28f, and hence no burrs occur on the inner surfaces 26f and 28f. Also, because the underside 44c of the projection 44 defines the upper surfaces 26e and 28e of the claws 26a and 28a of the hooks 26 and 28, any parting line does not exist on the upper surfaces 26e and 28e, and hence no burrs occur on the upper surfaces 26e and 28e.

It should be noted that, although a burr as shown in FIG. 9 might occur at a portion that the projection 44 underside 44c of the first movable metal mold 38 directly contacts with the recessed portion 46b bottom surface 46e of the second movable metal mold part 40, such burr 54 is not formed on the hooks 26 and 28 and can easily removed.

As clear from FIG. 9, the projection 44 is set in length to a sum of a thickness of the mount base 22 of the resin package 16 and a length of between the underside of the mount base 22 and the upper surface 26e, 28e, of the claw 26a, 28a of the hook 26, 28.

In the above embodiment, the opening or through-hole 24 is formed in the mount base 22 of the resin package 16, in the vicinity of which the hooks 26 and 28 are formed on the underside of the mount base 22. Accordingly, the projection 44 of the first movable metal mold 38, which is to form an opening or through-hole 24, effectively serves to define side surfaces or claw upper surfaces of the hooks 26 and 28. This can completely prevent burrs from occurring in these portions.

In the above embodiment, one opening or through-hole 24 was formed in the mount base 22 of the resin package 16 by the one projection 44 of the first movable metal mold 38. Alternatively, as shown in FIG. 10 two projections 56 and 58 may be formed on the first movable metal mold 38, thereby forming two openings or through-holes 24a and 24b in the mount base 22.

Figure 10:
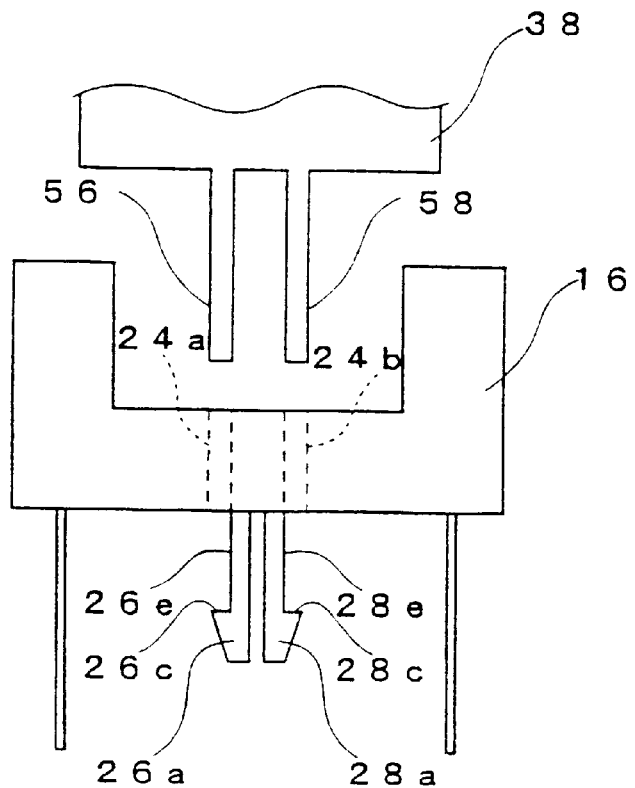
FIG. 10 is an illustrative view showing metal molds for forming a resin package according to another embodiment of this invention and a resin package.

In the FIG. 10 embodiment, the two projections 56 and 58 are formed on the first movable metal mold 38. These projections define outer surfaces 26g and 28g and upper surfaces 26e and 28e of claws 26a and 28a of hooks 26 and 28 close to the through-holes 24a and 24b. In this embodiment, the claws 26a and 28a of the hooks 26 and 28 have respective tips directed back-to-back, differently from the FIG. 3 embodiment. The claws 26a and 28a may be arbitrary set in direction as in FIG. 3 or in FIG. 10, by taking into consideration circuit board specification and its mount stability.

Figure 11:
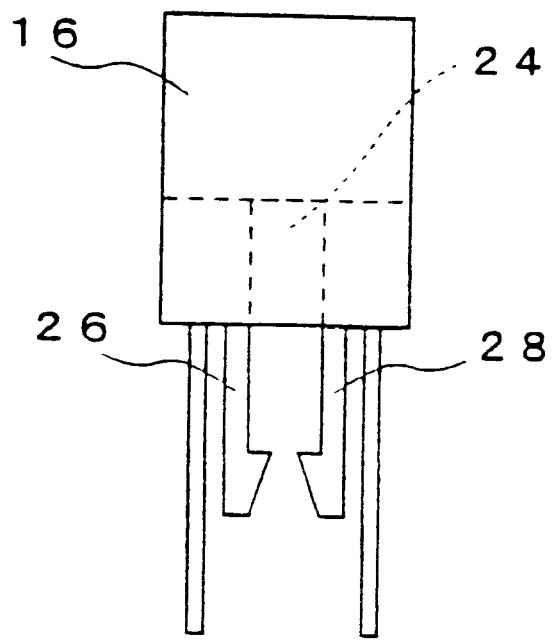
FIG. 11 is a schematic side view showing another embodiment of this invention.
Figure 12:
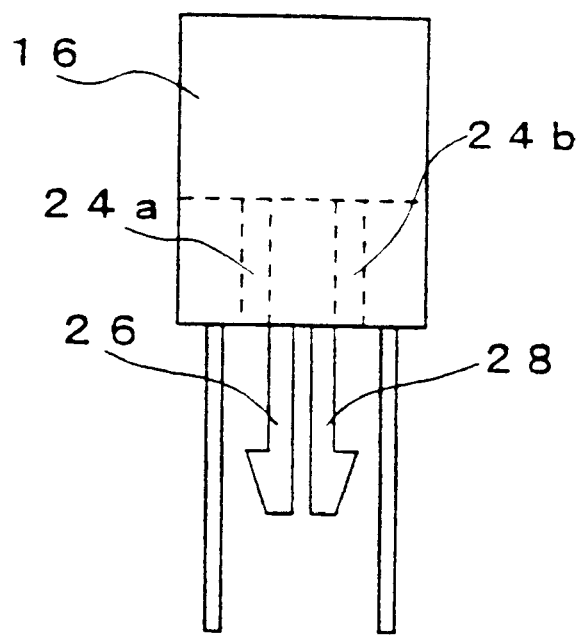
FIG. 12 is a schematic side view showing still another embodiment of this invention.

Furthermore, in the FIG. 3 and FIG. 10 embodiments, the hooks 26 and 28 were formed in the underside of the mount base 22, with a spacing given in a longer side direction of the resin package 16. In contrast, the hooks 26 and 28 may be formed arranged in a shorter side direction of the resin package 16, as shown in FIG. 11 and FIG. 12. That is, the direction of arranging the hooks 26 and 28 may be selected in either the longer side direction or the shorter side direction by taking into consideration circuit board specification and its mount stability.

Incidentally, in the FIG. 11 embodiment, one through-hole 24 is formed in the mount base similarly to the FIG. 3 embodiment whereby two hooks 26 and 28 having respective claw tips facing to each other are formed by one projection of the first movable metal mold. Also, in the FIG. 12 embodiment, two through-holes 24a and 24b are formed in the mount base similarly to the FIG. 10 embodiment whereby two hooks 26 and 28 having respective claw tips directed opposite to each other are formed by two projections of the first movable metal mold.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electronic part, comprising:
   a mounting base formed by resin molding, said mounting base being formed to have an upper surface and a lower surface, said lower surface being placed on an upper surface of a circuit board;
   an opening penetrating from said upper surface to said lower surface of said mounting base; and
   a mounting leg formed by resin molding integral with said mounting base in a manner extending from said lower surface of said mounting base in a position close to said opening, wherein
      said mounting leg is formed by a metal mold which forms no parting line on said mounting leg, wherein said opening is formed by said metal mold and used to form said mounting leg.

2. An electronic part according to claim 1, wherein said mounting leg includes a claw formed at a lower end thereof and integral therewith.

3. An electronic part according to claim 2, said mounting leg having a side surface thereof defined by a side surface of said metal mold, and said claw having an upper surface defined by a lower surface of said metal mold.

4. An electronic part according to claim 3, wherein said opening is formed by said metal mold, said mounting leg including two mounting legs, said mounting legs having respective ones of said claw upper surface being defined by said metal mold.

5. An electronic part according to claim 3, wherein said opening is formed by two of said metal mold, said mounting leg including two mounting legs, said mounting legs having respective ones of said claw upper surface defined by said two metal molds.

6. A photo-interrupter comprising:
   a mounting base formed by resin molding, said mounting base being formed to have an upper surface and a lower surface, said lower surface being placed on an upper surface of a circuit board;

an opening penetrating from said upper surface to said lower surface of said mounting base;

a mounting leg formed by resin molding integral with said mounting base in a manner extending from said lower surface of said mounting base in a position close to said opening, said mounting leg being formed by a metal mold which forms no parting line on said mounting leg;

a first portion and a second portion that are integrally formed with said mounting base, said first portion and said second portion extending upwardly from said upper surface of said mounting base and formed with a spacing given between;

a light emitting device accommodated in said first portion, said light emitting device including a light emitting chip molded by a light transmissive resin; and a light receiving device accommodated in said second portion, said light receiving device including a light receiving chip molded by a light transmissive resin, said light receiving chip receiving light from said light emitting chip, wherein said opening is formed by said metal mold and used to form said mounting leg.

7. A photo-interrupter according to claim 6, wherein said mounting leg includes a claw formed at a lower end and integral with said mounting leg.

8. A photo-interrupter according to claim 7, wherein said mounting leg has a side surface defined by a side surface of said metal mold, and said claw having an upper surface defined by a lower surface of said metal mold.

9. A photo-interrupter according to claim 8, wherein said opening is formed by said metal mold, said mounting leg including two mounting legs, said mounting legs having respective ones of said claw upper surface being defined by said metal mold.

10. A photo-interrupter according to claim 8, wherein said opening is formed by two of said metal mold, said mounting leg including two mounting legs, said mounting legs having respective ones of said claw upper surface defined by said two metal molds.

* * * * *